United States Patent
Wang et al.

(10) Patent No.: US 9,204,546 B2
(45) Date of Patent: Dec. 1, 2015

(54) CIRCUIT BOARD AND MANUFACTURING METHOD THEREOF

(71) Applicants: Chin-Sheng Wang, Hsinchu County (TW); Ching-Sheng Chen, Hsinchu County (TW); Chun-Kai Lin, Hsinchu County (TW); Chao-Min Wang, Hsinchu County (TW)

(72) Inventors: Chin-Sheng Wang, Hsinchu County (TW); Ching-Sheng Chen, Hsinchu County (TW); Chun-Kai Lin, Hsinchu County (TW); Chao-Min Wang, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 35 days.

(21) Appl. No.: 14/181,739

(22) Filed: Feb. 17, 2014

(65) Prior Publication Data

US 2015/0163908 A1 Jun. 11, 2015

(30) Foreign Application Priority Data

Dec. 10, 2013 (TW) .............................. 102145450 A

(51) Int. Cl.
*H05K 1/11* (2006.01)
*H05K 3/40* (2006.01)
*H05K 3/00* (2006.01)

(52) U.S. Cl.
CPC .............. *H05K 1/113* (2013.01); *H05K 3/4007* (2013.01); *H05K 1/115* (2013.01); *H05K 3/0097* (2013.01);

(Continued)

(58) Field of Classification Search
CPC ................... H01L 2924/1517; H01L 2224/92; H01L 2924/01029; H01L 2224/83; H01L 2924/14; H01L 23/49827; H01L 23/49822; H01L 23/5389; H01L 2224/0401; H01L 2224/73204; H01L 21/4857; H01L 2224/04105; H01L 24/19; H01L 2223/5448; H01L 2223/54486; H01L 2924/18162; H01L 2224/13147; H01L 24/821; H01L 2224/81192; H01L 24/81; H01L 2224/12105; H01L 2224/13025; H01L 2224/05572; H01L 2224/13018; H01L 2224/16237; H01L 23/3114; H01L 23/3128; H01L 2224/05008; H01L 2224/05022; H01L 2224/111; H01L 2224/11474; H01L 2225/06517; H01L 24/03; H05K 1/185; H05K 3/4652; H05K 1/115; H05K 2203/0733; H05K 2201/09509; H05K 3/0094; H05K 1/183; H05K 3/3452; H05K 3/421; H05K 2203/0577; H05K 3/064; H05K 3/30; H05K 1/189; H05K 3/007; B32B 2457/08

See application file for complete search history.

(56) References Cited

U.S. PATENT DOCUMENTS 6,534,723 B1 * 3/2003 Asai ................... H01L 23/49811
174/255
6,653,170 B1 * 11/2003 Lin ....................... H01L 21/563
257/E21.503

(Continued)

FOREIGN PATENT DOCUMENTS

CN 2626190 7/2004
TW 201039416 11/2010

OTHER PUBLICATIONS

"Office Action of Taiwan Counterpart Application", issued on Dec. 9, 2014, p. 1-p. 3.

*Primary Examiner* — Thomas L Dickey
*Assistant Examiner* — Gustavo Ramallo
(74) *Attorney, Agent, or Firm* — Jianq Chyun IP Office

(57) ABSTRACT

A circuit board includes a circuit layer, a first solder resist layer, a second solder resist layer and at least one conductive bump. The first solder resist layer is disposed on a lower surface of the circuit layer and has at least one first opening exposing a portion of the lower surface of the circuit layer. The second solder resist layer is disposed on an upper surface of the circuit layer and has at least one second opening exposing a portion of the upper surface of the circuit layer. The conductive bump is disposed inside the second opening of the second solder resist layer and directly connects to the upper surface of the circuit layer exposed by the second opening. A top surface of the conductive bump is higher than a second surface of the second solder resist layer.

17 Claims, 21 Drawing Sheets

(52) U.S. Cl.
CPC  *H05K 2201/0376* (2013.01); *H05K 2201/0959* (2013.01); *H05K 2201/09509* (2013.01); *H05K 2203/0152* (2013.01); *H05K 2203/0156* (2013.01); *H05K 2203/1536* (2013.01); *H05K 2203/1563* (2013.01)

(56) References Cited

U.S. PATENT DOCUMENTS

| | | | |
|---|---|---|---|
| 7,842,597 B2* | 11/2010 | Tsai | H01L 24/97 257/686 |
| 2007/0001284 A1* | 1/2007 | Kim | H01L 21/4846 257/698 |
| 2007/0176284 A1* | 8/2007 | Choi | H01L 25/105 257/718 |
| 2008/0007927 A1* | 1/2008 | Ito | H01L 23/49822 361/764 |
| 2009/0146317 A1* | 6/2009 | Shih | H01L 24/11 257/778 |
| 2011/0189848 A1* | 8/2011 | Ewert | C25D 3/32 438/612 |
| 2013/0082091 A1* | 4/2013 | Matejat | B23K 31/02 228/176 |

* cited by examiner

CIRCUIT BOARD AND MANUFACTURING METHOD THEREOF

CROSS-REFERENCE TO RELATED APPLICATION

This application claims the priority benefit of Taiwan application serial no. 102145450, filed on Dec. 10, 2013. The entirety of the above-mentioned patent application is hereby incorporated by reference herein and made a part of this specification.

BACKGROUND OF THE INVENTION

1. Field of the Invention

The invention generally relates to a substrate and manufacturing method thereof. More particularly, the invention relates to a circuit board and manufacturing method thereof.

2. Description of Related Art

With integrated circuit (IC) packaging technology, wire bonding or flip chip bonding are typical methods for electrically connecting chips and circuit boards. Taking the flip chip bonding as an example, copper bumps are firstly formed on chips, and then chips are electrically connected to circuit boards through the copper bumps on the chips. However, owing to high risk of manufacturing copper bumps in wafer level, yield must be strictly controlled, and complexity of rework will directly response to the manufacturing cost and time.

SUMMARY OF THE INVENTION

Accordingly, the invention is directed to a circuit board having conductive bumps.

The invention also provides a method of manufacturing a circuit board for manufacturing the aforementioned circuit board.

The invention provides a circuit board including an insulation layer, a patterned circuit layer, a conductive connecting structure, a first solder resist layer, a second solder resist layer, and at least one conductive bump. The insulation layer has an upper surface and a lower surface opposite to each other. The patterned circuit layer is embedded in the insulation layer, and a surface of the patterned circuit layer is aligned with the upper surface of the insulation layer. The insulation layer has at least one blind via extending from the lower surface to the patterned circuit layer. The conductive connecting structure includes a conductive pattern layer and at least one conductive pillar. The conductive pattern layer is disposed on the lower surface of the insulation layer, and the conductive pillar is disposed inside the blind via and connects patterned circuit layer and the conductive pattern layer. The first solder resist layer is disposed on the lower surface of the insulation layer and has at least one first opening. The first opening exposes a portion of the conductive pattern layer so as to define at least one first pad. The second solder resist layer is disposed on the upper surface of the insulation layer and has at least one second opening. The second opening exposes a portion of the patterned circuit layer so as to define at least one second pad. The conductive bump is disposed on the second pad, wherein a top surface of the conductive bump is higher than a second surface of the second solder resist layer.

According to an embodiment of the invention, the conductive bump includes a copper bump and a copper foil layer. The copper bump is located between the copper foil layer and the second pad, and a height of the copper bump is greater than a height of the second resist layer.

According to an embodiment of the invention, the conductive bump includes a copper foil layer, a copper bump, and a nickel gold layer. The copper foil layer is located between the copper bump and the second pad. The copper bump is located between the cooper foil layer and the nickel gold layer. A height of the cooper bump is greater than a height of the second solder resist layer.

According to an embodiment of the invention, the conductive bump includes a first copper foil layer, a nickel layer, and a second copper foil layer. The first copper foil layer is located between the nickel layer and the second pad. The nickel layer is located between the first copper foil layer and the second copper foil layer. A thickness of the second copper foil layer is greater than a thickness of the first copper foil layer.

According to an embodiment of the invention, the conductive bump includes a nickel bump and a copper foil layer. The nickel bump is located between the copper foil layer and the second pad, and a height of the nickel bump is greater than a height of the second solder resist layer.

According to an embodiment of the invention, the circuit board further includes a surface treatment layer, disposed on the first pad. A top surface of the surface treatment layer is lower than a first surface of the first solder resist layer.

According to an embodiment of the invention, a portion of the first solder resist layer extends into the blind via and fills up the blind via with the conductive pillar.

The invention provides a circuit board including a circuit layer, a first solder resist layer, a second solder resist layer, and at least one conductive bump. The circuit layer has an upper surface and a lower surface opposite to each other. The first solder resist layer is disposed on the lower surface of the circuit layer, and has at least one first opening exposing a portion of the lower surface of the circuit layer. The second solder resist layer is disposed on the upper surface of the circuit layer, and has at least one second opening exposing a portion of the upper surface of the circuit layer. The conductive bump is disposed inside the second opening of the second solder resist layer and directly contacts the upper surface of the circuit layer exposed by the second opening. A top surface of the conductive bump is higher than a second surface of the second solder resist bump.

The invention provides a method of manufacturing a circuit board including following steps. A first dielectric layer and two metal layers are provided. The metal layers are disposed on the two opposite side surfaces of the first dielectric layer. A patterned circuit layer is respectively formed on the metal layers. An insulation layer and a copper foil layer disposed on the insulation layer are respectively pressed on the patterned circuit layers. At least one blind via is respectively formed by passing through the copper foil layers and extending to the patterned circuit layers. A conductive connecting structure is respectively formed by plating with the copper foil layers. Each of the conductive connecting structures includes a conductive pattern layer and at least one conductive pillar. Each of the conductive pattern layers is disposed on a lower surface of the corresponding insulation layer, and each of the conductive pillars is disposed inside the corresponding blind via and connects the corresponding patterned circuit layer and the conductive pattern layer. A first solder resist layer is respectively formed on the lower surfaces of the insulation layers. Each of the first solder resist layers has at least one first opening, and the first opening exposes a portion of the corresponding conductive pattern layer so as to define at least one first pad. The first dielectric layer is removed and a second dielectric layer is pressed between the first solder resist layers to expose the metal layers. A portion of the metal layer is removed so as to define at least one conductive bump on the upper surface of each of the insulation layers. A surface of each of the patterned circuit layers is aligned with the upper surface of the corresponding insulation layer. A second solder resist layer is respectively formed on the upper surfaces of the insulation layers. Each of the second solder resist layers has at least one second opening, and the second opening exposes a portion of the corresponding patterned circuit layer so as to define at least one second pad. The conductive bumps are disposed corresponding to the second pads. The second dielectric layer is removed to expose the first solder resist layers.

According to an embodiment of the invention, each of the metal layers is a copper foil layer, and the metal layers are disposed on the two side surfaces of the first dielectric layer by a pressing process.

According to an embodiment of the invention, the steps of removing the portion of the metal layers so as to define the conductive bumps includes that a nickel layer is respectively formed by plating with the copper foil layers, wherein the nickel layers respectively cover the copper foil layers. A portion of the nickel layers are removed to expose a portion of the copper foil layers. At least one copper bump is respectively formed by plating with the portion of the copper foil layers exposed by the nickel layers, wherein the copper bumps respectively contact the portion of the copper foil layers. The nickel layers and the other portion of the copper foil layers not contacting with the copper bumps are removed to expose a portion of the upper surfaces of the insulation layers.

According to an embodiment of the invention, the steps of removing the portion of the metal layers so as to define the conductive bumps includes that a copper bump and a nickel gold layer located on the copper bump are respectively formed by plating with the copper foil layers, wherein the copper bumps respectively cover a portion of the copper foil layers. The other portion of the copper foil layers uncovered by he copper bumps is removed to expose a portion of the upper surfaces of the insulation layers.

According to an embodiment of the invention, the steps of removing the portion of the metal layers so as to define the conductive bumps includes that a nickel bump is respectively formed by plating with the copper foil layers, wherein the nickel bumps respectively cover a portion of the copper foil layers. The other portion of the copper foil layers uncovered by the nickel bumps is removed to expose a portion of the upper surfaces of the insulation layers.

According to an embodiment of the invention, a portion of the first solder resist layer extends into the blind via and fills up the blind via with the conductive pillar.

According to an embodiment of the invention, each of the meal layers is a metal stacked layer. The metal stacked layer is stacked by a first copper foil layer, a nickel layer, and a second copper foil layer. The nickel layer is located between the first copper foil layer and the second copper foil layer, and a thickness of the second copper foil layer is greater than a thickness of the first copper foil layer, and the first dielectric layer is located between the second the second copper foil layers.

According to an embodiment of the invention, the steps of removing the portion of the metal layers so as to define the conductive bumps includes that a portion of the second copper foil layers is removed to expose a portion of the nickel layers. The other portion of the nickel layers uncovered by the second copper foil layers is removed to expose a portion of the first copper foil layers. The portion of the first copper foil layers is removed to expose a portion of the upper surfaces of the insulation layers.

According to an embodiment of the invention, each of the metal layers includes a copper foil layer, a plating nickel layer, and a plating copper layer. The plating nickel layer is located between the copper foil layer and the plating copper layer, a thickness of the copper foil layer is thicker than a thickness of the plating copper layer, and the first dielectric layer is located between the copper foil layers.

According to an embodiment of the invention, the method of manufacturing the circuit board further includes respectively forming a surface treatment layer on the corresponding first pad after respectively forming the first solder resist layers on the lower surfaces of the insulation layers, and before removing the first dielectric layer and pressing the second dielectric layer between the first solder resist layers. A top surface of each of the surface treatment layers is lower than a first surface of the corresponding first solder resist layer.

Based on the above, in comparison with the prior art where the conductive bumps should be firstly formed on chips, and then the chips flip on the circuit boards, in the present invention the circuit board has the conductive bumps, hence the subsequent manufacturing processes of connecting the chips to the circuit board can be reduced, and the product reliability and the convenience of the subsequent manufacturing processes can be effectively enhanced.

Several exemplary embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
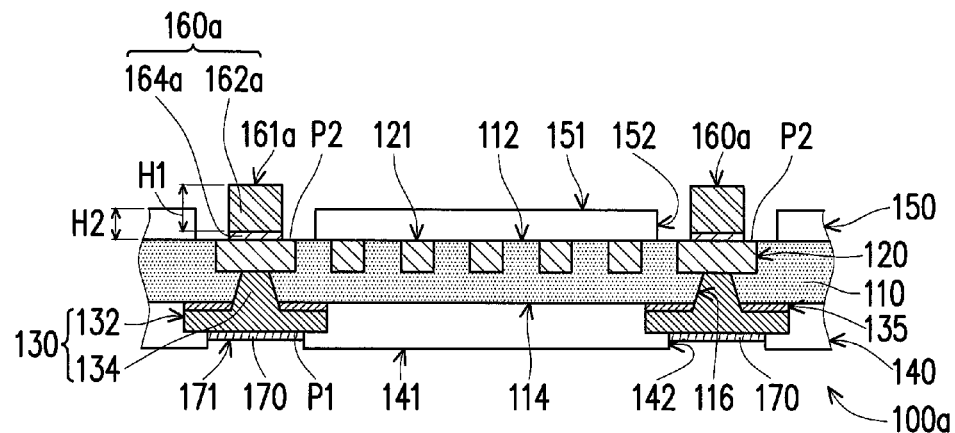
FIG. 1 is a schematic cross-sectional view illustrating a circuit board according to an embodiment of the invention.

FIG. 1 is a schematic cross-sectional view illustrating a circuit board according to an embodiment of the invention. Referring to FIG. 1, in the present embodiment, a circuit board 100a includes an insulation layer 100, a patterned circuit layer 120, a conductive connecting structure 130, a first solder resist layer 140, a second solder resist layer 150, and at least one conductive bump 160a (two conductive bumps are illustrated in FIG. 1). The insulation layer 110 has an upper surface 112 and a lower surface 114 opposite to each other. The patterned circuit layer 120 is embedded in the insulation layer 110, and a surface 121 of the patterned circuit layer 120 is aligned with the upper surface 112 of the insulation layer 110. The insulation layer 110 has at least one blind via 116 (two blind vias 116 are illustrated in FIG. 1) extending from the lower surface 114 to the patterned circuit layer 120.

The conductive connecting structure 130 includes a conductive pattern layer 132 and at least one conductive pillar 134 (two conductive pillars are illustrated in FIG. 1). The conductive pattern layer 132 is disposed on the lower surface 114 of the insulation layer 110, and the conductive pillar 134 are disposed inside the blind vias 116 and connects patterned circuit layer 120 and conductive pattern layer 132. The first solder resist layer 140 is disposed on the lower surface 114 of the insulation layer 110, and has at least one first opening 142. The first opening 142 exposes a portion of the conductive pattern layer 132 so as to define a least one first pad P1 (two first pads P1 are illustrated in FIG. 1). The second solder resist layer 150 is disposed on the upper surface 112 of the insulation layer 110, and has at least one second opening 152. The second opening 152 exposes a portion of the patterned circuit layer 120 so as to define at least one second pad P2 (two second pads P2 are illustrated in FIG. 1). The conductive bumps 160a are disposed on the second pads P2, wherein a top surface 161a of each of the conductive bumps 160a is higher than a second surface 151 of the second solder resist layer 150.

As shown in FIG. 1, each of the conductive bumps 160a of the present embodiment is specifically to be composed by a copper bump 162a and a copper foil layer 164a, wherein the copper bump 162a is located between the copper foil layer 164a and the corresponding second pad P2, and a height H1 of the copper bump 162a is greater than a height H2 of the second solder resist layer 150. Herein, an aperture of each of the second openings 152 of the second solder resist layer 150 is greater than a width of each of the second pads P2, therefore, the second openings 152 also expose a portion of the upper surface 112 of the insulation layer 110. The orthogonal projection area of each of the conductive bumps 160a on the upper surface 112 of the insulation layer 110 is smaller, equal or greater than the orthogonal area of each of the second pads P2 on the upper surface 112 of the insulation layer 110.

Moreover, the circuit board 100a of the present embodiment further includes a surface treatment layer 170 disposed on the first pads P1, wherein a top surface 171 of the surface treatment layer 170 is lower than first surface 141 of the first solder resist layer 140. Furthermore, in order to increase the reliability of the conductive connecting structure 130, a copper foil layer 135 may also be alternatively formed between the lower surface 114 of the insulation layer 110 and the conductive pattern layer 132, then the copper foil layer 135 is taken as a plating seed layer to increase the reliability of plating the conductive connecting structure 130.

In brief, in comparison with the prior art where the conductive bump should be firstly formed on the chips, and then the chips flip on the circuit boards, in the present invention the circuit board 100a had the conductive bumps 160a, hence the subsequent manufacturing processes of connecting the chips (not illustrated) to the circuit board 100a can be reduced, and the product reliability and the convenience of the subsequent manufacturing processes can be effectively enhanced. Moreover, the orthogonal projection area of each of the conductive bumps 160a on the upper surface 112 of the insulation layer 110 can be smaller, equal, or greater than the orthogonal projection area of each of the second pads P2 on the upper surface 112 of the insulation layer 110. Therefore, if a light emitting chip (e.g., light emitting diode chip, not illustrated) is connected to the conductive bumps 160a of the circuit board 100a in the follow-up process, the region of second pads P2 exposed by the conductive bumps 160a can be improve the reflectivity of the light emitting chip, and an entire chip package structure (not illustrated) may have a preferable light emitting efficiency.

It should be noted that, the following embodiments adopt the component notations and partial contents of the embodiments aforementioned, wherein the same notations denote the same or similar components and description of same technical contents are omitted. Reference can be made to the aforementioned embodiment for description of the omitted part which is not repeated herein.

Figure 2:
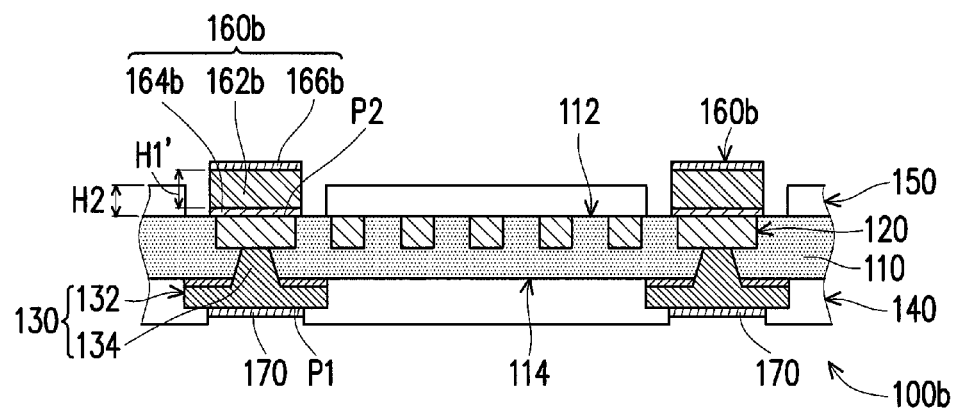
FIG. 2 is a schematic cross-sectional view illustrating a circuit board according to another embodiment of the invention.

FIG. 2 is a schematic cross-sectional view illustrating a circuit board according to another embodiment of the invention. Referring to FIG. 2, the circuit board 100b of the present embodiment is similar to the circuit board 100a of FIG. 1, the difference between the circuit board 100b and the circuit board 100a is that each of the conductive bumps 160b of the present embodiment is composed by a copper bump 162b, a copper foil layer 164b, and a nickel gold layer 166b. The copper foil layer 164b is located between the copper bump 162b and the corresponding second pad P2. The cooper bump 162b is located between the copper foil layer 164b and the nickel gold layer 166b, and a height H1' of the copper bump 162b is greater than the height H2 of the second solder resist layer 150. Here, the orthogonal projection area of each of the conductive bumps 160b on the upper surface 112 of the insulation layer 110 can be smaller, equal, or greater than the orthogonal projection area of each of the second pads P2 on the upper surface 112 of the insulation layer 110.

Figure 3:
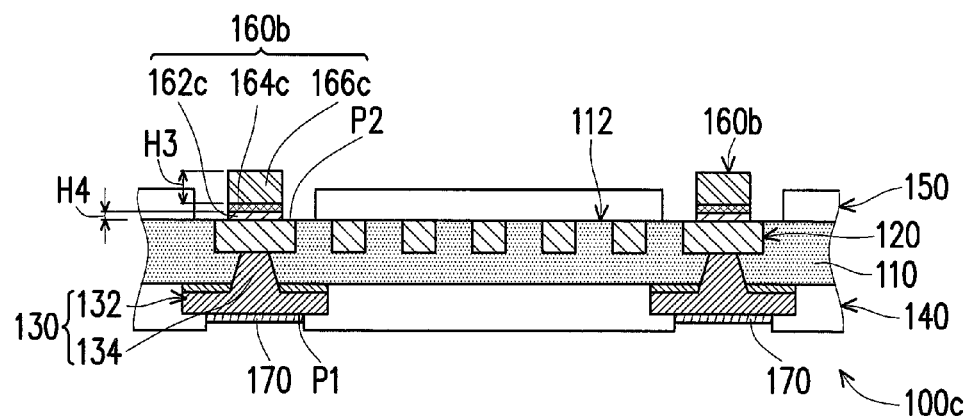
FIG. 3 is a schematic cross-sectional view illustrating a circuit board according to another embodiment of the invention.

FIG. 3 is a schematic cross-sectional view illustrating a circuit board according to another embodiment of the invention. Referring to FIG. 3, the circuit board 100c of the present embodiment is similar to the circuit board 100a of FIG. 1, the main difference between them is that each of the conductive bumps 160c is composed by a first copper foil layer 162c, a nickel layer 164c, and a second copper foil layer 166c, wherein the first copper foil layer 162c is located between the nickel layer 164c and the corresponding second pads P2, and the nickel layer 164c is located between the first copper foil layer 162c and the second copper foil layer 166c, and a thickness H4 of the second copper foil layer 166c is greater than a thickness H3 of the first copper foil layer 162c. Herein, the orthogonal area of each of the conductive bumps 160c on the upper surface 112 of the insulation layer 110 can be smaller, equal, or greater than the orthogonal area of each of the second pads P2 on the upper surface 112 of the insulation layer 110.

Figure 4:
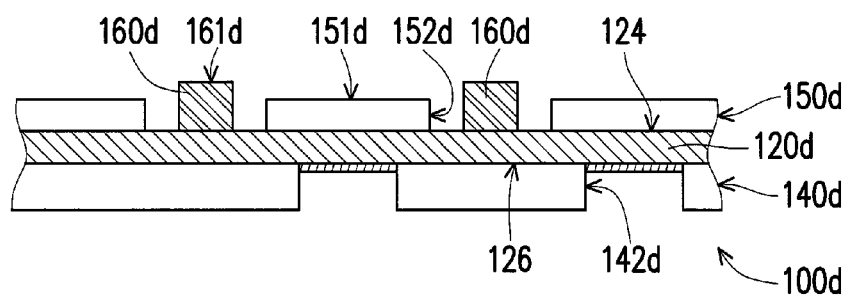
FIG. 4 is a schematic cross-sectional view illustrating a circuit board according to another embodiment of the invention.

Although the aforementioned circuit boards 100a, 100b, 100c all adopt two circuit layers (i.e., the patterned circuit layer 120 and the conductive pattern layer 132) for illustration, in the other embodiment, referring to FIG. 4, the circuit board 100d of the present embodiment may also utilize only one a single circuit layer 120d.

Specifically, referring to FIG. 4, in the present embodiment, the circuit board 100d includes a circuit layer 120d, a first solder resist layer 140d, a second solder resist layer 150d, and at least one conductive bump 160d (two conductive bump 160d are illustrated in FIG. 4). The circuit layer 120d has an upper surface 124 and a lower surface 126 opposite to each other. The first solder resist layer 140d is disposed on the lower surface 126 of the circuit layer 120d and has at least one first opening 142d exposing a portion of the lower surface 126 of the circuit layer 120d. The second solder resist layer 150d is disposed on the upper surface 124 of the circuit layer 120d, and has at least one second opening 152d exposing a portion of the upper surface 124 of the circuit board 120d. The conductive bumps 160d are disposed inside of the second openings 152d of the second solder resist layer 150d, and directly contact the upper surface 124 of the circuit layer 120d exposed by the second openings 152d. Particularly, a top surface 161d of each of the conductive bumps 160d is higher than a second surface 151d of the second solder resist layer 150d. Herein, each of the conductive bumps 160d is specified as a pure copper conductive bump. Certainly, in other embodiments there are not illustrated, the aforementioned conductive bumps 160a, 160b, and 160c can also be used, and those with ordinary skill in the art can refer the descriptions of the aforementioned embodiment to select the aforementioned elements according to an actual demand, so as to achieve a required technical effect.

The following are four embodiments illustrating the method of manufacturing the circuit boards 100a, 100b, 100c, and FIG. 5A to FIG. 5L, FIG. 6A to FIG. 6C, FIG. 7A to FIG. 7K, and FIG. 8A to FIG. 8B complement the description of the method of manufacturing the circuit board 100a, 100b, and 100c in more detail.

Figure 5A:
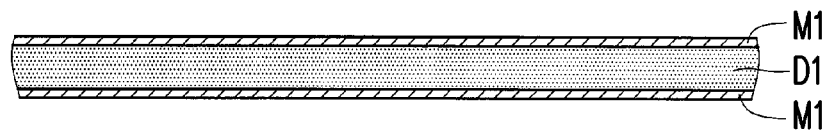
FIG. 5A to FIG. 5L is a schematic cross-sectional view illustrating a method of manufacturing a circuit board according to an embodiment of the invention.

FIG. 5A to FIG. 5L is a schematic cross-sectional view illustrating a method of manufacturing a circuit board according to an embodiment of the invention. Referring first to FIG. 5A, in accordance with the method of manufacturing the circuit board 100a of the present embodiment, a first dielectric layer D1 and two metal layers M1 are firstly provided, wherein the metal layers M1 are respectively disposed on the two opposite side surfaces of the first dielectric layer D1. Herein, each of the metal layers M1 is specified as copper foil layer, and the metal layer M1 are disposed on two side surfaces of the first dielectric layer D1 by a thermal pressing process.

Figure 5B:
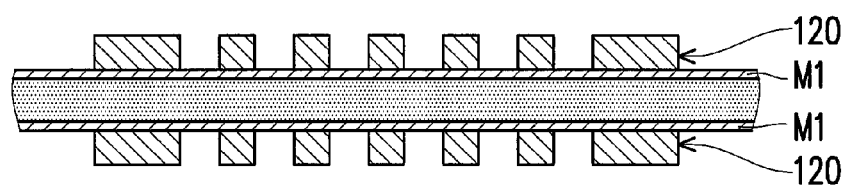

Next, referring to FIG. 5B, a patterned circuit layer 120 is respectively formed on the metal layers M1. The method of forming the patterned conductive layer 120 is, for example, forming a patterned photo-resist layer (not shown) on the metal layers M1, wherein the patterned photo-resist layer exposes a portion of the metal layers M1. The metal layers M1 are taken as plating seed layer and the patterned circuit layer 120 are plated on the metal layers M1 exposed by the patterned photo-resist layer. Afterwards, after removing the patterned photo-resist layer, the patterned circuit layers 120 exposing a portion of the metal layers M1 are formed.

Figure 5C:
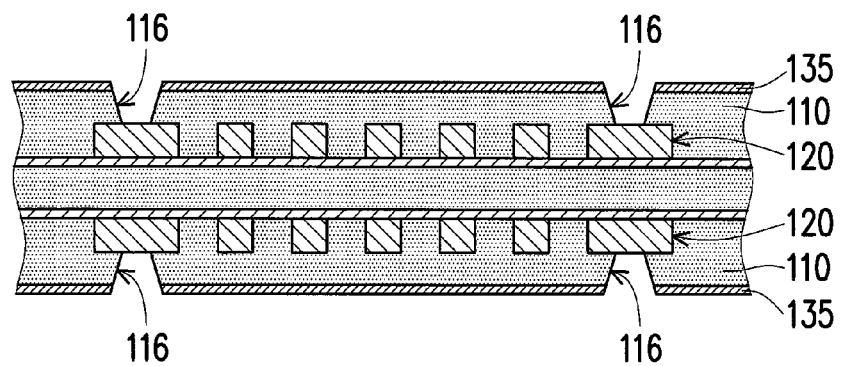

Next, referring to FIG. 5C, an insulation layer 110 and a copper foil layer 135 disposed on the insulation layer 110 are respectively pressed on the patterned circuit layers 120. Then, at least one blind via 116 is respectively formed passing through the copper foil layers 135 and extending to the patterned circuit layers 120.

Figure 5D:
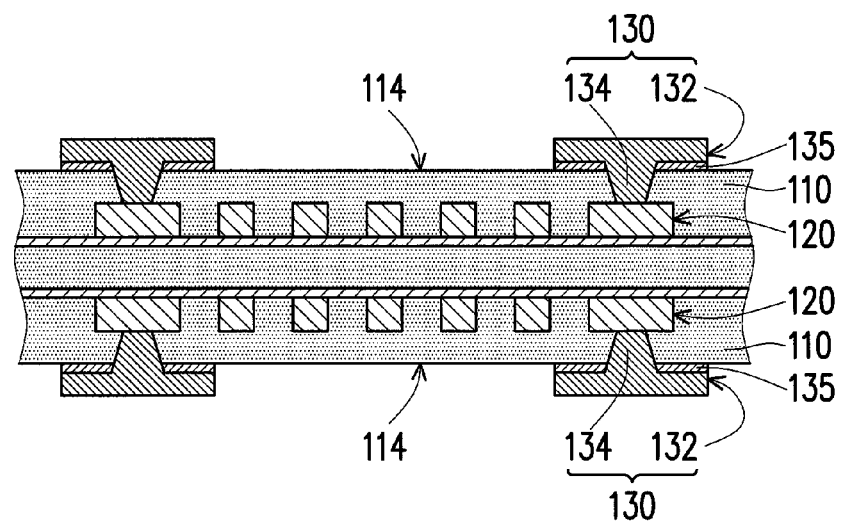

Next, referring to FIG. 5D, a conductive connecting structure 130 is respectively formed by plating with the copper foil layer 135. Specifically, a conductive material layer (not shown) is plated in the blind vias 116 and on the copper foil layers 135, wherein the conductive material layer is filled up the blind vias 116 and completely covers the copper foil layers 135. Afterwards, the conductive connecting structures 130 are formed by covering the patterned photo-resist layer (not shown) and etching the conductive material layer uncovered by patterned photo-resist layer. As shown in 5D, each of the conductive connecting structure 130 includes a conductive pattern layer 132 and at least one conductive pillar 134, wherein each of the conductive pattern layer 132 is disposed on the lower surface 114 of the corresponding insulation layer 110, and each of the conductive pillars 134 is disposed inside of the corresponding blind via 116 and connects the corresponding patterned circuit layer 120 and the conductive pattern layer 132.

Figure 5E:
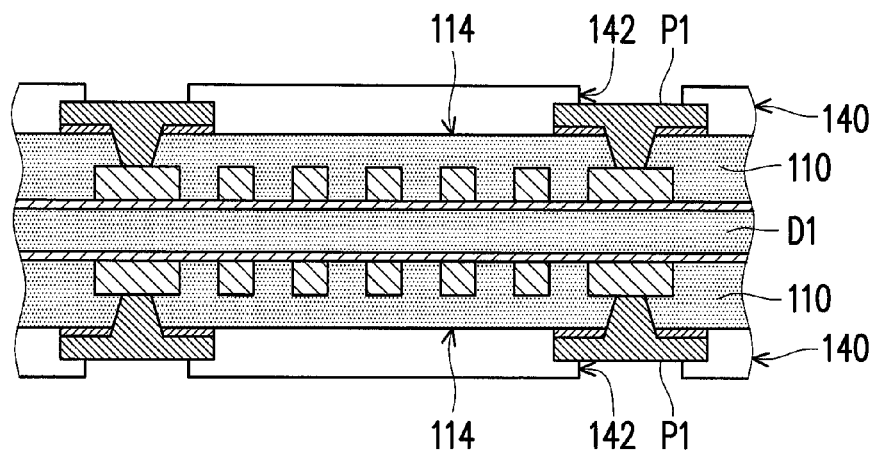

Next, referring to FIG. 5E, a first solder resist layer 140 is respectively formed on the lower surfaces 114 of the insulation layers 110, wherein each of the first solder resist layers 140 has at least one first opening 142 (two first openings 142 are illustrated in FIG. 5E), and each of the first openings 142 exposes a portion of the corresponding patterned conductive layer 132 so as to define at least one first pad P1.

Figure 5F:
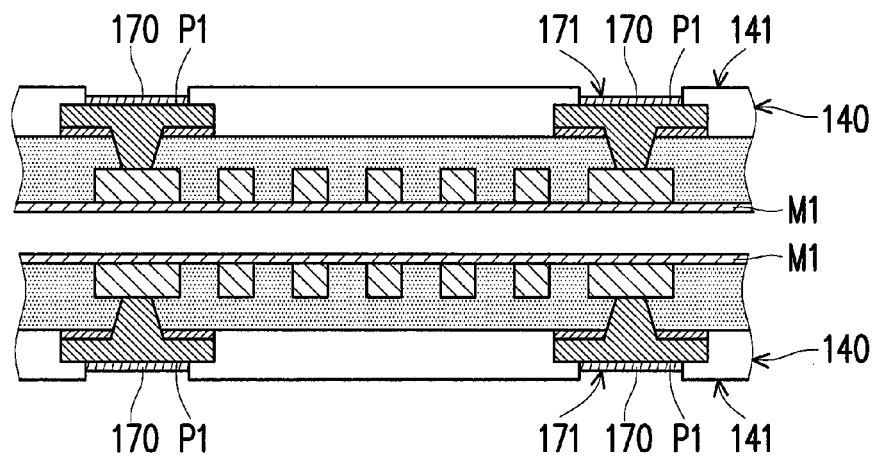
Figure 5G:
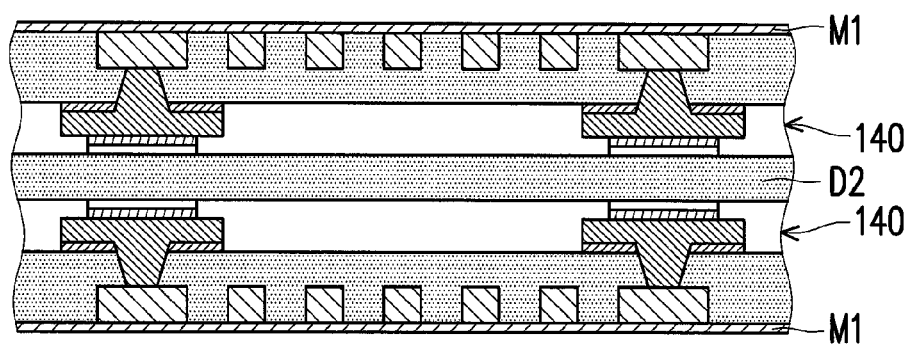

Next, referring to FIG. 5E and FIG. 5F, the first dielectric layer D1 is removed, and metal layers M1 are exposed. And then, a surface treatment layer 170 is respectively formed on the corresponding first pads P1, wherein a top surface 171 of each of the surface treatment layers 170 is lower than a first surface 141 of the corresponding first solder resist layer 140. Referring to FIG. 5F and FIG. 5G, a second dielectric layer D2 is pressed between the first solder resist layers 140. Meanwhile, as shown in FIG. 5G, the metal layers M1 are located at two outermost sides of the whole structure layer, and the first solder resist layers 140 are attached together temporarily by the second dielectric layer D2.

Figure 5H:
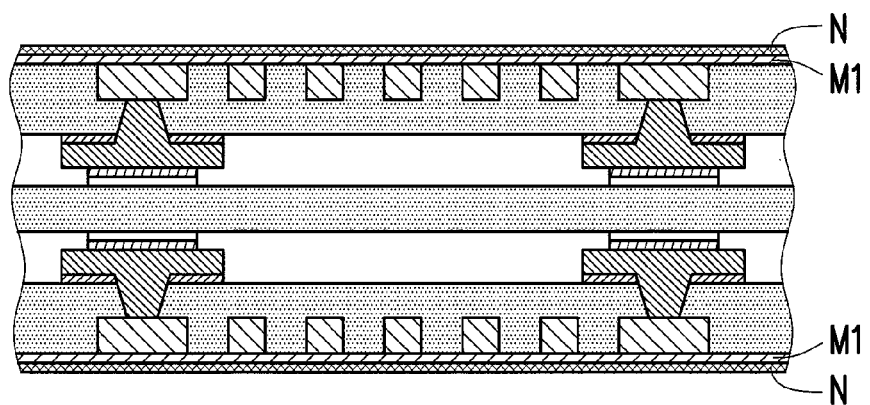

Next, referring to FIG. 5H, a nickel layer is respectively formed by plating with the copper foil layers (i.e., the metal layers M1), wherein the nickel layers N respectively cover the copper foil layers (i.e., the metal layers M1).

Figure 5I:
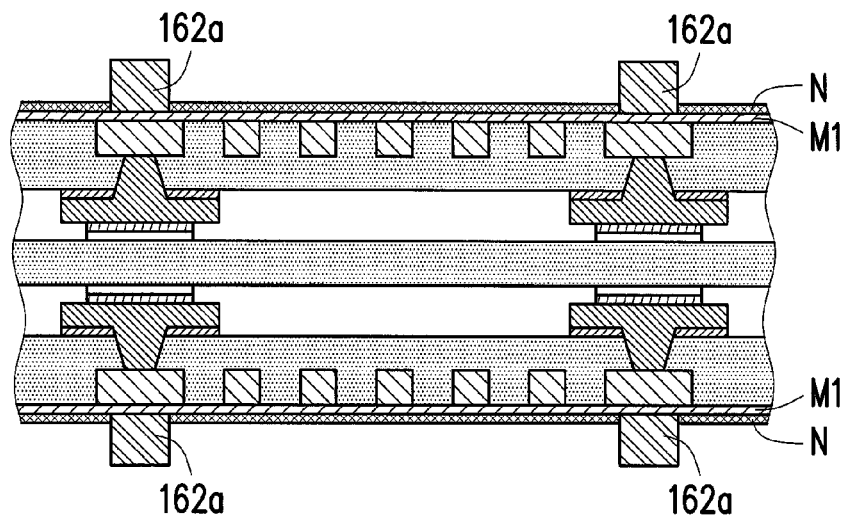

Next, referring to FIG. 5I, a portion of the nickel layers N is removed by peeling to expose a portion of the copper foil layers (i.e., the metal layers M1). Then, at least one copper bump 162a is respectively formed by plating with the portion of the copper foil layers (i.e., the metal layers M1) exposed by the nickel layer N, wherein the copper bumps 162a respectively contact the portion of the copper foil layers (i.e., the metal layers M1) exposed by the nickel layer N.

Figure 5J:
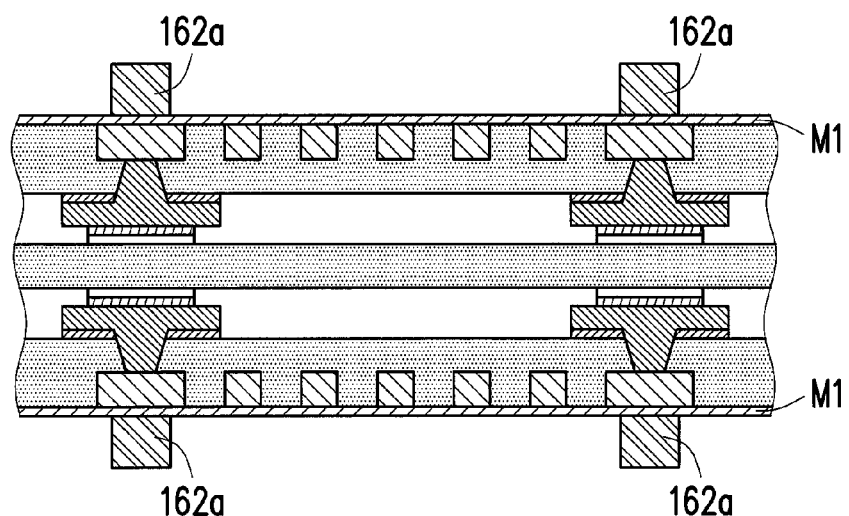

Next, referring to FIG. 5I and FIG. 5J, the nickel layer N is removed by peeling to expose copper foil layers (i.e., the metal layers M1).

Figure 5K:
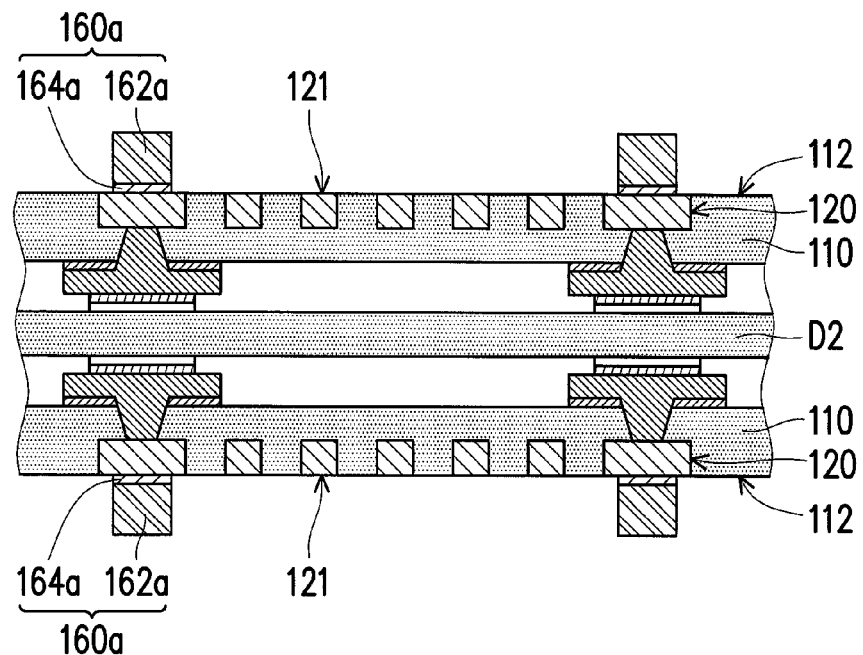

Next, referring to FIG. 5J and FIG. 5K, the other portion of the copper foil layers (i.e., the metal layer M1) not contacting with the copper bumps 162a is removing by flash etching to expose a portion of the upper surfaces 112 of the insulation layers 110. Meanwhile, the upper surface 112 of each of the insulation layers 119 defines at least one conductive bump 160a (two conductive bumps are illustrated in FIG. 5K), wherein each of the conductive bumps 160a is composed by a copper bump 162a and a copper foil layer 164a, and a surface 121 of each of the patterned circuit layers 120 is aligned with the upper surface 112 of the corresponding insulation layer 110.

Figure 5L:
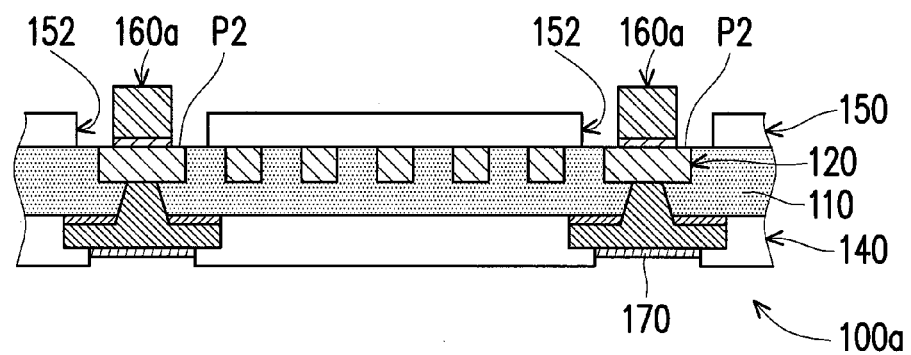

Afterwards, referring to FIG. 5K and FIG. 5L, a second solder resist layer 150 is respectively formed on the upper surfaces 112 of the insulation layers 110. Each of the second solder resist layers 150 has at least one second opening 152 and the second openings 152 expose a portion of the corresponding patterned circuit layer 120 so as to define at least one second pad P2. The conductive bumps 160a are respectively disposed corresponding to the second pads P2. Finally, the second dielectric layer D2 is removed to expose the first solder resist layers 140 and the surface treatment layers 170 located on the first pads P1. At the time, the circuit board 100a has been manufactured.

Figure 6A:
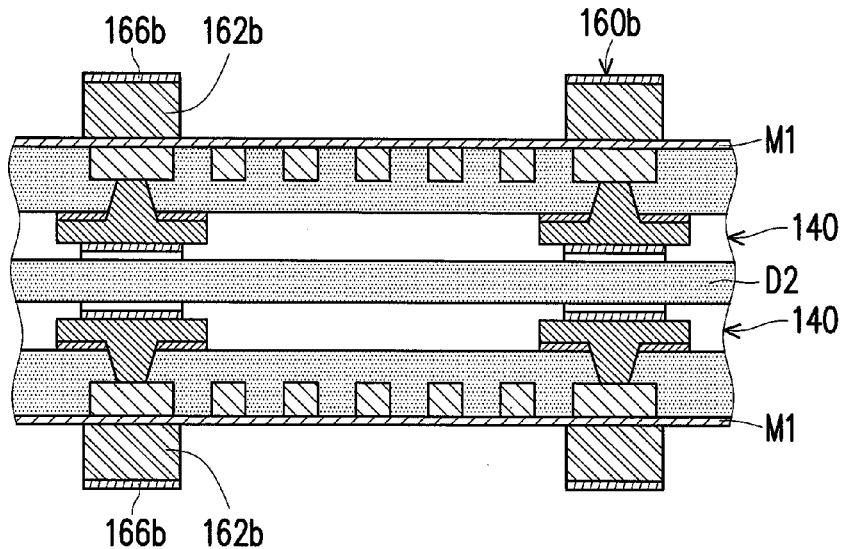
FIG. 6A to FIG. 6C is a schematic cross-sectional view illustrating partial steps of a method of manufacturing a circuit board according to another embodiment of the invention.
Figure 6B:
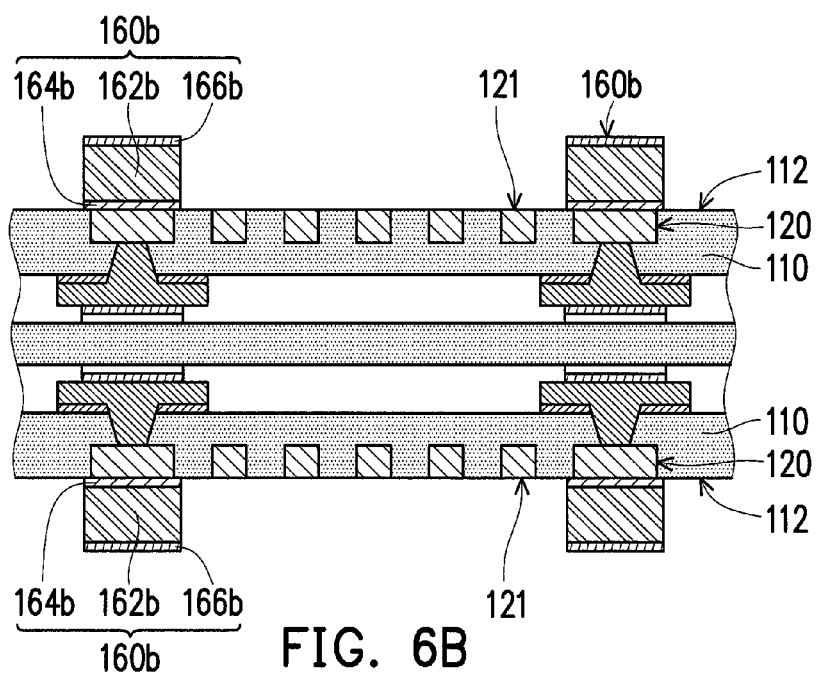
Figure 6C:
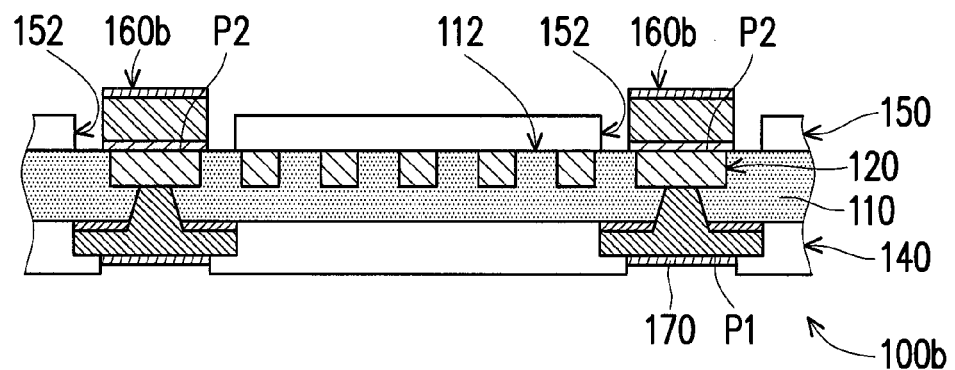

FIG. 6A to FIG. 6C is a schematic cross-sectional view illustrating partial steps of a method of manufacturing a circuit board according to another embodiment of the invention. A manufacturing method of the circuit board 100b of the present embodiment is approximately the same to that of the circuit board 100a of the aforementioned embodiment, and after the step in FIG. 5G, i.e. the metal layers M1 are located at two outermost sides of the whole structure layer, and the first solder resist layers 140 are attached together temporarily by the second dielectric layer D2, referring to FIG. 6A, a copper bump 162b and a nickel gold layer 166b located on the copper bump 162b are respectively formed by plating with the copper foil layers (i.e., the metal layers M1), wherein the copper bumps 162b respectively cover a portion of the copper foil layers (i.e., the metal layers M1).

Next, referring to FIG. 6B the other portion of the copper foil layers (i.e., the metal layers M1) uncovered by the copper bumps 162b is removed by flash etching to expose a portion of the upper surfaces 112 of the insulation layers 110. Meanwhile, the upper surface 112 of each of the insulation layer 110 defines at least one conductive bump 160b (two conductive bumps are illustrated in FIG. 6B), wherein each of the conductive bumps 160b is composed by a conductive bump 162b, a copper foil layer 164b, and a nickel gold layer 116b, and a surface 121 of each of the patterned circuit layer 120 is aligned with the upper surface 112 of the corresponding insulation layer 110.

Finally, referring to FIG. 6B and FIG. 6C, a second solder resist layer 150 is respectively formed on the upper surfaces 112 of the insulation layers 110. Each of the second solder resist layers 159 has at least one second opening 152, and the second openings 152 expose a portion of the corresponding patterned circuit layer 120 so as to define at least one second pad P2. The conductive bumps 160b are respectively disposed corresponding to the second pads P2. Last, the second dielectric layer D2 is removed to expose the first solder resist layers 140 and the surface treatment layers 170 located on the first pads P1. At the time, the circuit board 100b had been manufactured.

Figure 7A:
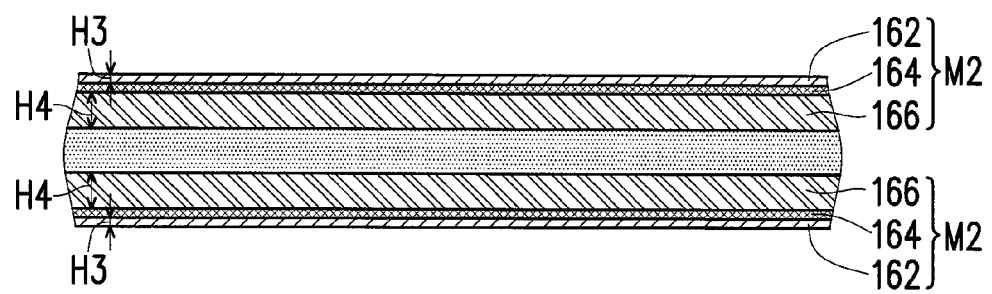
FIG. 7A to FIG. 7K is a schematic cross-sectional view illustrating a method of manufacturing a circuit board according to another embodiment of the invention.

FIG. 7A to FIG. 7K is a schematic cross-sectional view illustrating a method of manufacturing a circuit board according to another embodiment of the invention. Referring first to FIG. 7A, in accordance with the method of manufacturing a circuit board 100c of the present embodiment, a first dielectric layer D1 and two metal layers M2 are firstly provided, wherein the metal layers M2 are disposed on the opposite two side surfaces of the first dielectric layer D1. Herein, each of the metal layers M2 is specified as a metal stacked layer, the metal stacked layer is stacked by a first copper foil layer 162, a nickel layer 164, and a second copper foil layer 166. The nickel layer 164 is located between the first copper foil layer 152 and the second copper foil layer 166, and a thickness H4 of the second copper foil layer 166 is greater than a thickness H3 of the first copper foil layer 162, and the first dielectric layer D1 is located between the second copper foil layers 166. The metal layers M2 are disposed on two side surfaces of the first dielectric layer D1 by a thermal pressing process.

Figure 8A:
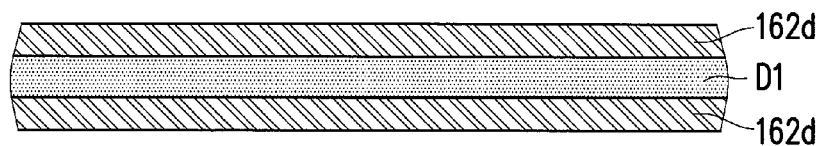
FIG. 8A to FIG. 8B is a schematic cross-sectional view illustrating partial steps of a method of manufacturing a circuit board according to another embodiment of the invention.
Figure 8B:
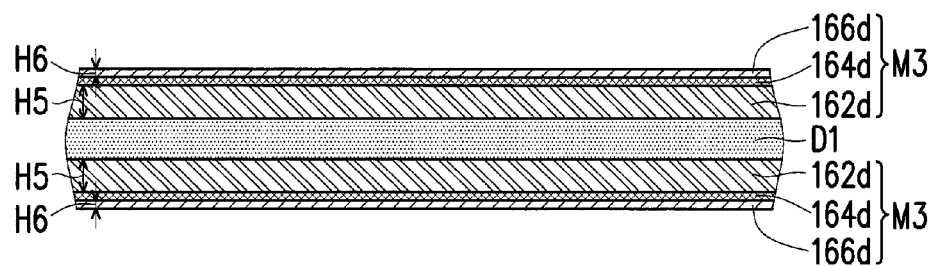

Certainly, in another embodiment, referring to FIG. 8A and FIG. 8B, each of the metal layer M3 may be also composed by a copper foil layer 162d, a plating nickel layer 164d and a plating copper layer 166d. First, the copper foil layers 162d are firstly pressed on two opposite side surfaces of the first dielectric layer D1 by a thermal pressing process. Then, the plating nickel layers 164d are formed on the copper foil layers 162d by plating with the copper foil layers 162d. Afterwards, the plating copper layers 166d are formed on the plating nickel layers 164d by plating with the plating nickel layers 164d. At this time, the plating nickel layers 164d are located between the corresponding copper foil layers 162d and the corresponding plating copper layers 166d, and a thickness H5 of each of the copper foil layers 162d is greater than a thickness H6 of each of the plating copper layer 166d, and the first dielectric layer D1 is located between the copper foil layers 162d.

Figure 7B:
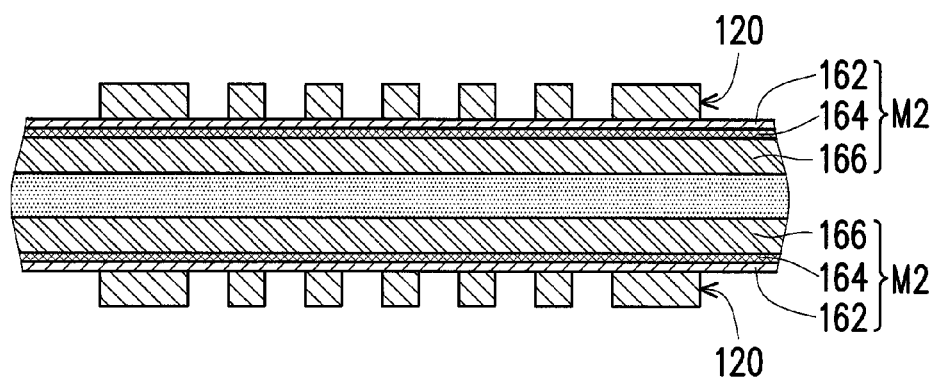

Next, referring to FIG. 7B, a patterned circuit layer 120 is respectively formed on the metal layers M2. The method of forming the patterned circuit layer 120 is, for example, forming a patterned photo-resist layer (not shown) on the metal layers M2, wherein the patterned photo-resist layers expose a portion of the first copper foil layers 162. The first copper foil layers 162 are taken as plating seed layer, and the patterned circuit layers 120 are plated on the first copper foil layers 152 exposed by patterned photo-resist layers. Then, after removing the photo-resist layers, the patterned circuit layers 120 exposing a portion of the first copper foil layer 162 are formed.

Figure 7C:
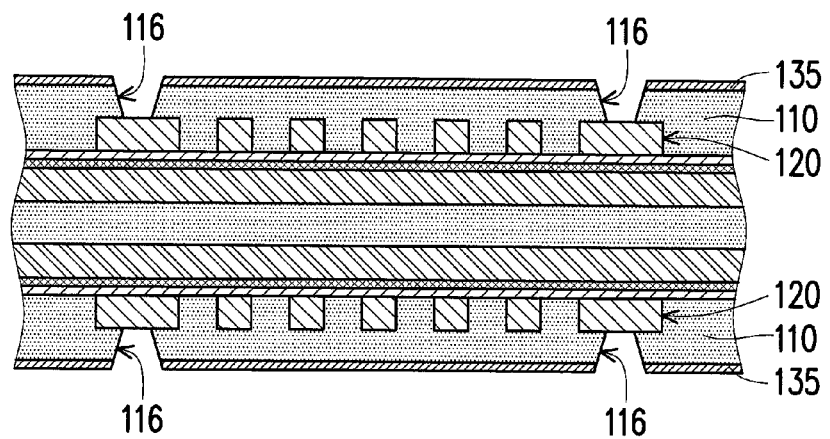

Next, referring to FIG. 7C, an insulation layer 110 and a copper foil layer 135 disposed the insulation layer 110 are respectively pressed on the patterned circuit layers 120. Then, at least one blind via 116 is also respectively formed passing through the copper foil layers 135 and extending to patterned circuit layers 120.

Figure 7D:
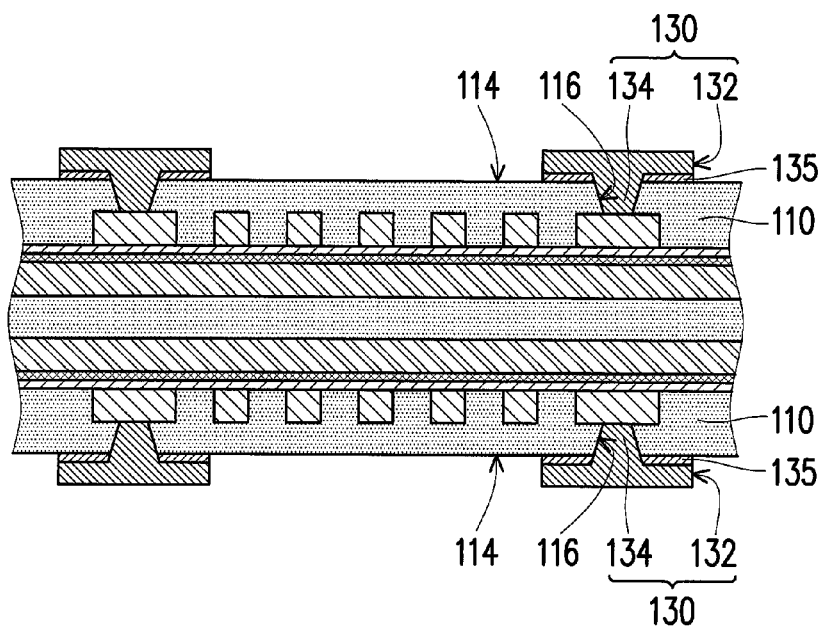

Next, referring to FIG. 7D, a conductive connecting structure 130 is respectively formed by plating with the copper foil layers 135. Specifically, a conductive material layer (not shown) is plated in the blind vias 116 and on the copper foil layers 135, wherein the conductive material layer fills up the blind vias 116 and fully covers copper foil layers 135. Afterwards, the conductive connecting structures 130 are formed by covering the patterned photo-resist layer (not shown) and etching the conductive material layer uncovered by patterned photo-resist layer. As shown in FIG. 7D, each of the conductive connecting structures 130 includes a conductive pattern layer 132 and at least one conductive pillar 134, wherein each of the conductive pattern layer 132 is disposed on the lower surface 114 of the corresponding insulation layer 110, and each of the conductive pillars is disposed inside of the corresponding blind via 116 and connects the corresponding patterned circuit layer 120 and the conductive pattern layer 132.

Figure 7E:
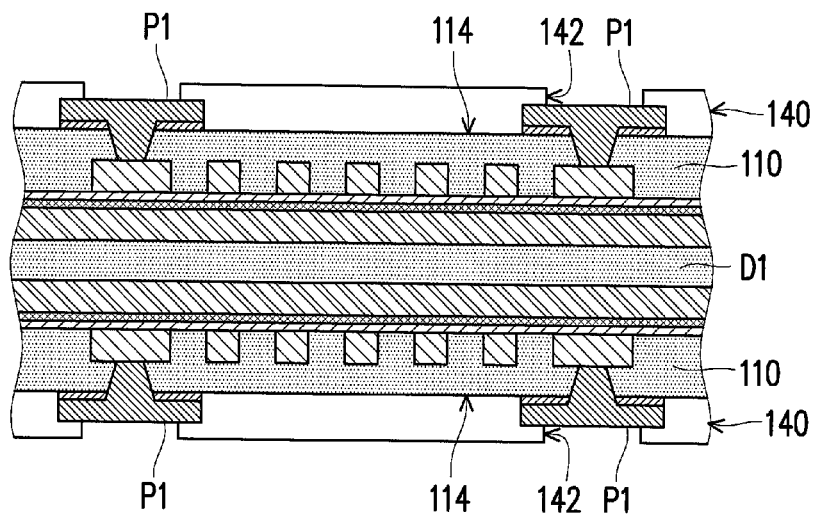

Next, referring to FIG. 7E, a first solder resist layer 140 is respectively formed on the lower surfaces 114 of the insulation layers 110, wherein each of the first insulation layers 140 has at least one first opening 142 (two first openings 142 are illustrated in FIG. 7E), and each of the first openings 142 exposes a portion of the corresponding conductive pattern layer 132 so as to define at least one first pad P1.

Figure 7F:
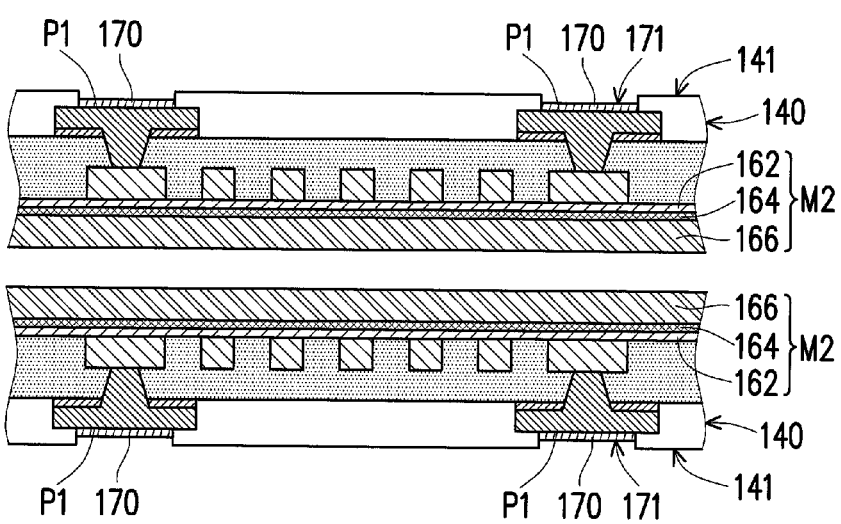
Figure 7G:
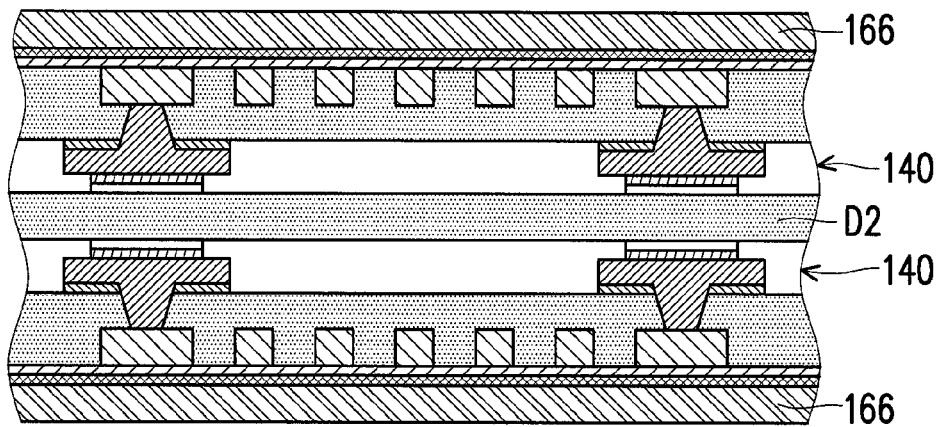

Then, referring to FIG. 7E and FIG. 7F, the first dielectric layer D1 is removed and the second copper foil layers 166 of the second metal layers M2 are exposed. Next a surface treatment layer 170 is respectively formed on the corresponding first pads P1, wherein a top surface 171 of each of the surface treatment layers 170 is lower than a first surface 141 of the corresponding first solder resist layer 140. Moreover, referring to both FIG. 7F and FIG. 7G, a second dielectric layer D2 is pressed between the first solder resist layers 140. At this time, as shown in FIG. 7G, the second copper foil layers 166 are located at two outermost sides of the whole structure layer, and the first solder resist layers 140 are attached together temporarily through the second dielectric layer D2.

Figure 7H:
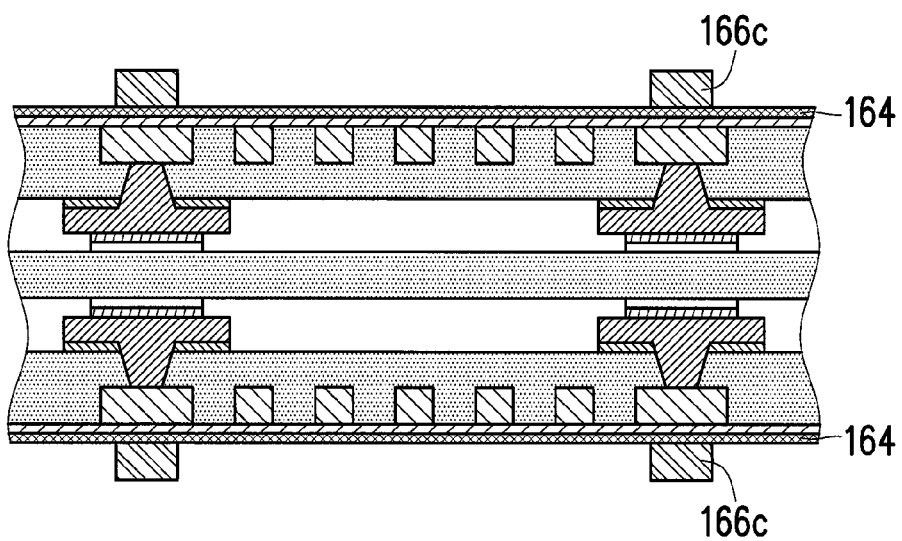

Next, referring to FIG. 7H, the nickel layers 164 are taken as etching stop layers, a portion of the second copper foil layers 166 is removed by an etching process and to form the second copper foil layers 166c, wherein the second copper foil layers 166c expose a portion of the nickel layers 164.

Figure 7I:
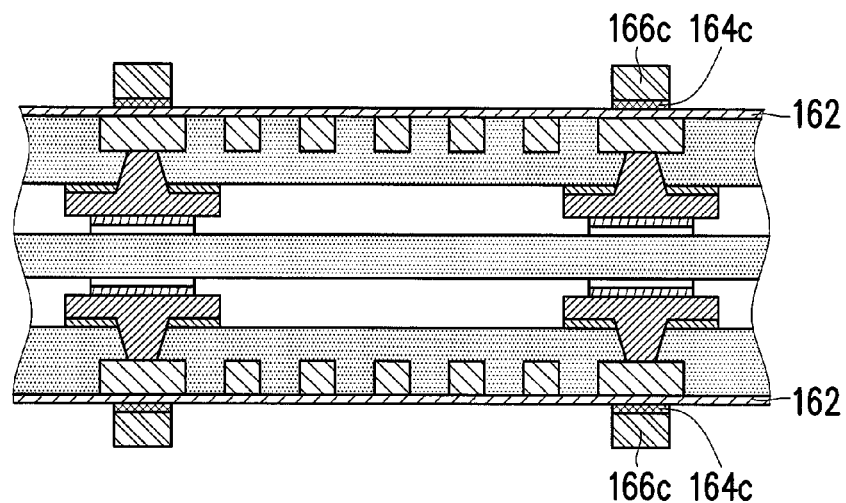

Next, referring to FIG. 7I, the other portion of the nickel layers 164 uncovered by the second copper foil layers 166c is removed by a peeling process to form the nickel layers 164c, wherein the nickel layers 164c and the second copper foil layers 166c are disposed conformally, and the nickel layers 164c expose a portion of the first copper foil layers 162.

Figure 7J:
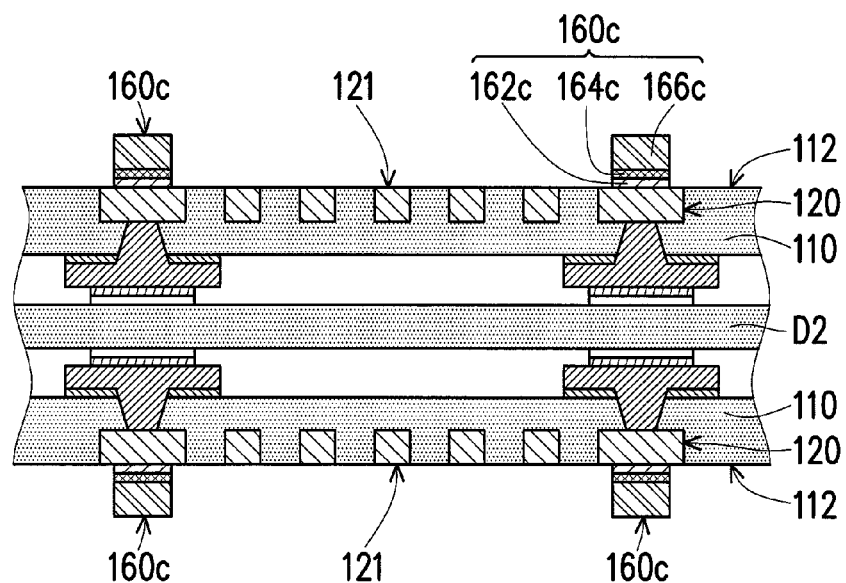

Next, referring to FIG. 7J, a portion of the first copper foil layers 162 uncovered the nickel layers 164c is removed by a flash etching process to form the first copper foil layers 162c and expose the upper surfaces 112 of the insulation layers 110. At this time, the first copper foil layers 162c, the nickel layers 164c, and the second copper foil layers 166c are disposed conformally to define at least one conductive bump 160c (two conductive bumps 160c are illustrated in FIG. 7J) on the upper surface 112 of each of the insulation layers 110. Herein, each of the conductive layer 160c is composed by the first copper foil layer 162c, the nickel layer 164c, and the second copper foil layer 166c, and a surface 121 of each of the patterned circuit layers 120 is aligned with the upper surface 112 of the corresponding insulation layer 110.

Figure 7K:
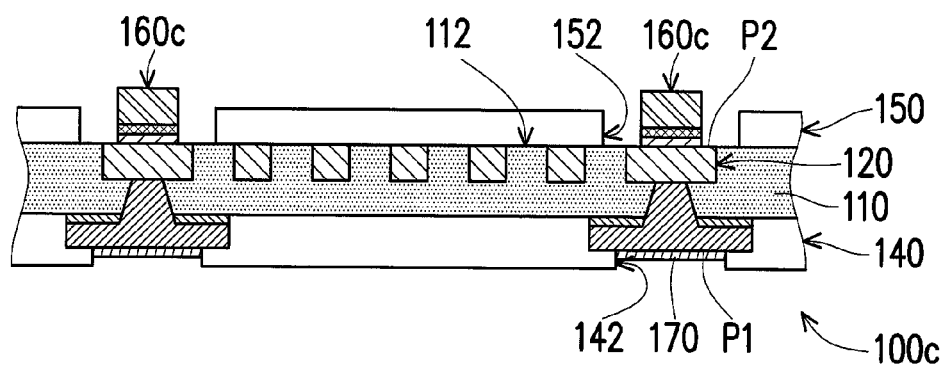

Next, referring to FIG. 7J and FIG. 7K, a second solder resist layer 150 is respectively formed on the upper surfaces 112 of the insulation layers 110. Each of the second solder resist layers 150 has at least one second opening 152, and the second openings 152 expose a portion of the corresponding patterned circuit layer 120 so as to define at least one second pad P2. The conductive bumps 160c are respectively disposed corresponding to the second pads P2. Finally, the second dielectric layer D2 is removed to expose the first solder resist layer 140 and the surface treatment layers 170 located on the first pads P1. At the time, the circuit board 100c has been manufactured.

Figure 9A:
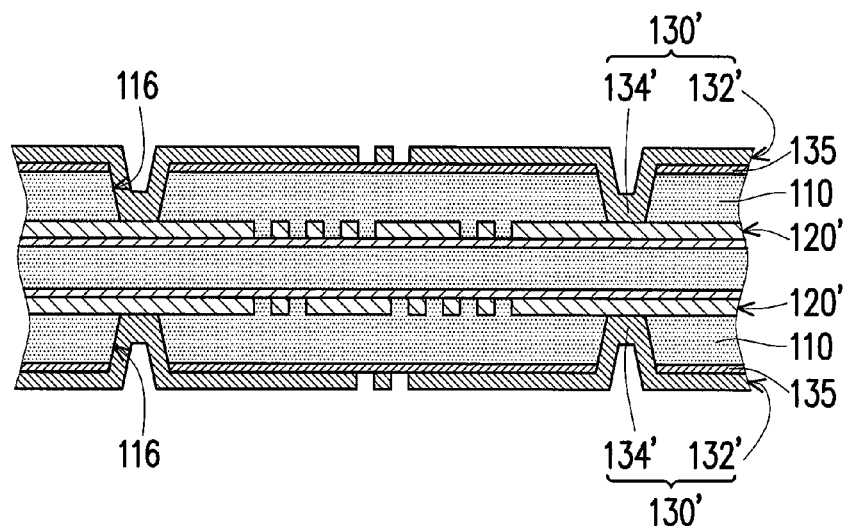
FIG. 9A to FIG. 9G is a schematic cross-sectional view illustrating partial steps of a method of manufacturing a circuit board according to another embodiment of the invention.

FIG. 9A to FIG. 9G is a schematic cross-sectional view illustrating partial steps of a method of manufacturing a circuit board according to another embodiment of the invention. A manufacturing method of the circuit board 100e of the present embodiment is approximately the same to the aforementioned embodiment, and after the step in FIG. 5C, i.e. at least one blind via 116 is respectively formed passing through the copper foil layers 135 and extending to the patterned circuit layers 120', referring to FIG. 9A, a conductive connecting structure 130' is respectively formed by plating with the copper foil layers 135. Specifically, a conductive material layer (not shown) is plated in the blind vias 116 and on the copper foil layers 135, wherein the conductive material layer does not fill up the blind vias 116 and fully covers the copper foil layers 135. Afterwards, the conductive connecting structures 130' are formed by covering the patterned photo-resist layer (not shown) and etching the conductive material layer uncovered by photo-resist layer, and a portion of the copper foil layers 135 is exposed. As shown in FIG. 9A, each of the conductive connecting structures 130' includes a conductive pattern layer 132' and at least one conductive pillar 134', wherein each of the conductive pattern layer 132' is disposed on the corresponding copper foil layer 135, and each of the conductive pillars 134' is deposed inside of the corresponding blind via 116 and connects the corresponding patterned circuit layer 120' and conductive pattern layer 132'.

Figure 9B:
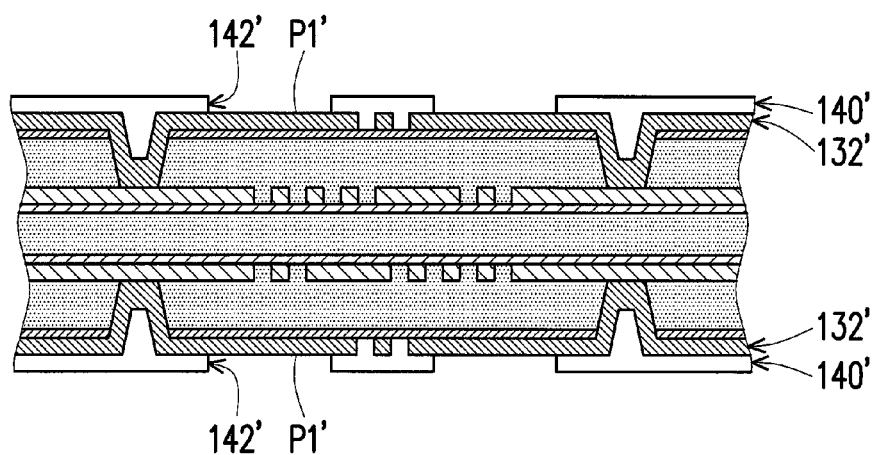

Next, referring to FIG. 9B, a first solder resist layer 140' is respectively formed on the conductive patterned layers 132', wherein each of the first solder resist layers 140' has at least one first opening 142' (two first openings 142' are illustrated in FIG. 9B), and the first openings 142' expose a portion of the corresponding conductive pattern layer 132' so as to define at least one first pad P1'. Herein, as shown in FIG. 9B, a portion of the first solder resist layers 140' of the present embodiment extends into the blind vias 116 and fills up the blind vias 116 with the conductive pillars 134'.

Figure 9C:
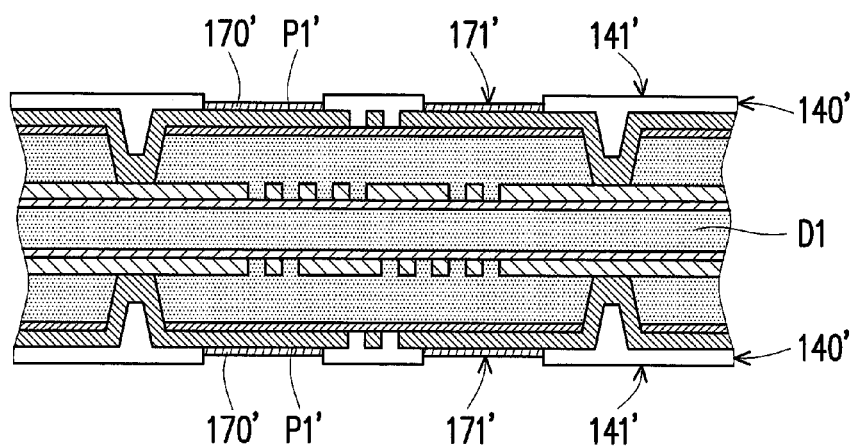

Next, referring to FIG. 9C, a surface treatment layer 170' is respectively formed on the corresponding first pad P1', wherein a top surfaces 171' of each of the surface treatment layers 170' is lower than a first surface 141' of the corresponding first solder resist layer 140'.

Figure 9D:
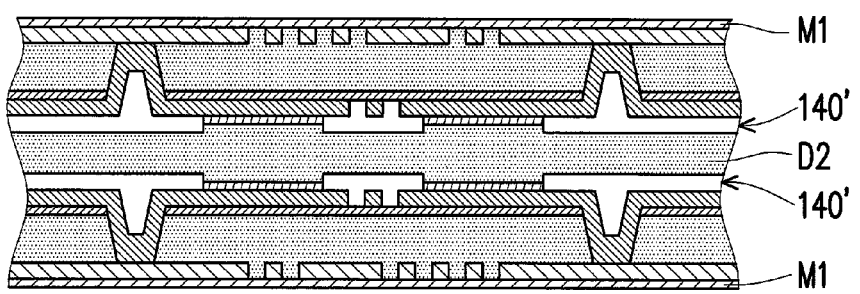

Next, referring to FIG. 9C and FIG. 9D, the first dielectric layer D1 is removed and a second dielectric layer D2 is pressed between the first solder resist layers 140. Meanwhile, as shown in FIG. 9D, the metal layers M1 are located at two outermost sides of the whole structure layer, and the first solder resist layers 140' are attached together temporarily through the second dielectric layer D2.

Figure 9E:
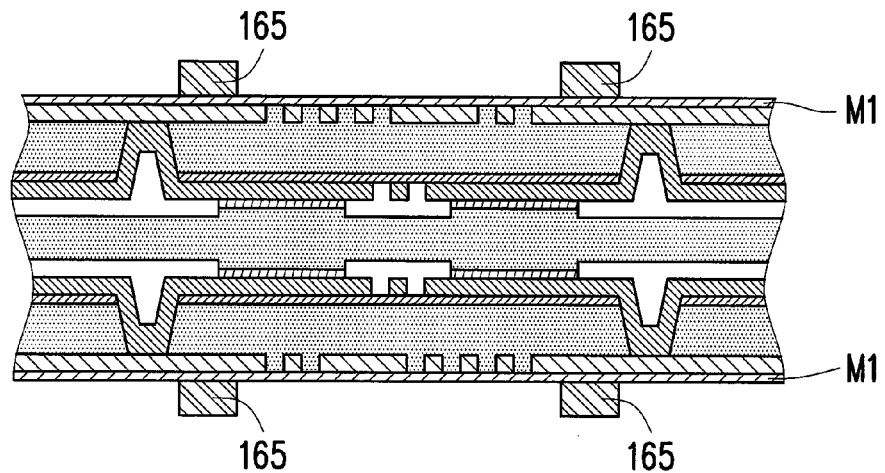

Next, referring to FIG. 9E, a plurality of nickel bumps 165 is formed by plating with the copper foil layers (i.e., the metal layers M1), wherein the nickel bumps 165 cover a portion of the copper foil layers (i.e., the metal layers M1) and expose the other portion of the copper foil layers (i.e., the metal layers M1).

Figure 9F:
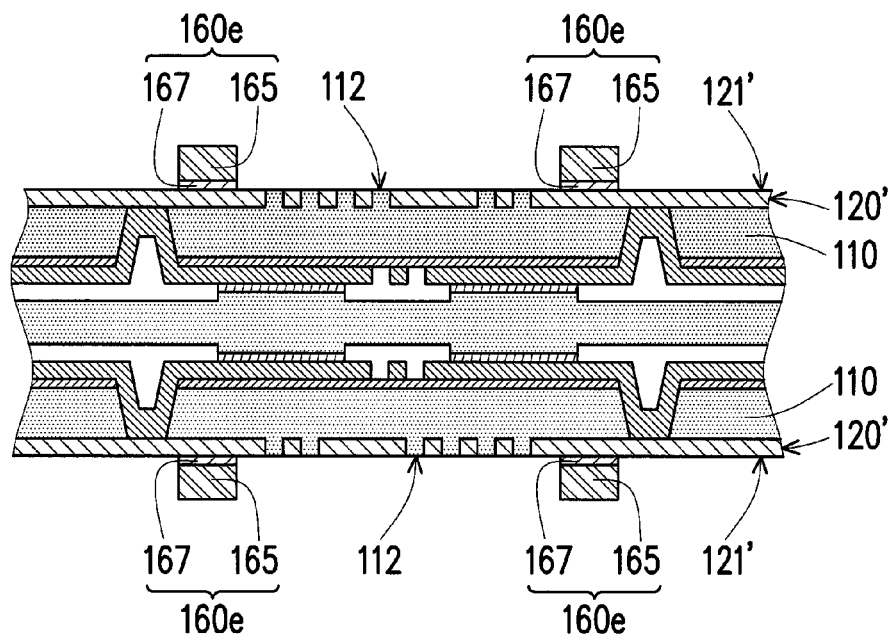

Afterwards, referring to FIG. 9F, the other portion of the copper foil layers (i.e., the metal layers M1) not contacting with the nickel bumps 165 is removed by the flash etching process to expose the patterned circuit layers 120' and a portion of the upper surfaces 112 of the insulation layers 110. Meanwhile, the upper surface 112 of each of the insulation layers 110 defines at least one conductive bump 160e (two conductive bumps 160e are illustrated in FIG. 9F), wherein each of the conductive bumps 160e is composed by a nickel bump 165 and a copper foil layer 167, and a surface 121' of each of the patterned circuit layers 120' is aligned with the upper surface 112 of the corresponding insulation layer 110.

Figure 9G:
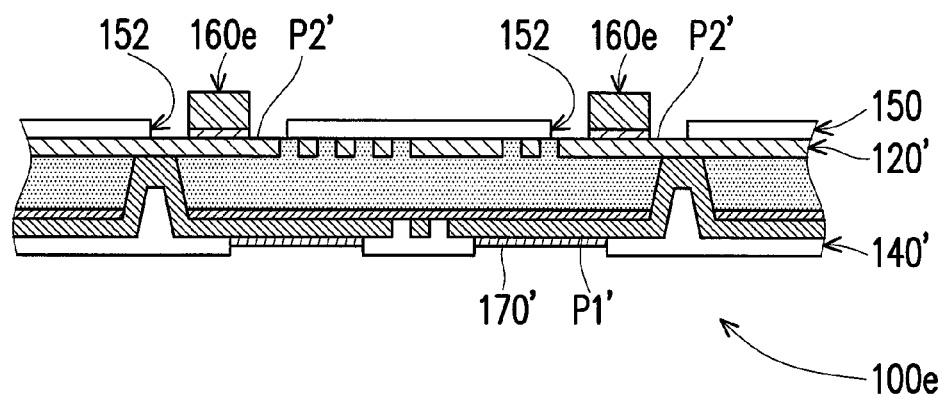

Finally, referring to FIG. 9F and FIG. 9G, a second solder resist layer 150 is respectively formed on the upper surfaces 112 of the insulation layers 110. Each of the second solder resist layers 150 has at least one second opening 152, and the second openings 152 expose a portion of the corresponding patterned circuit layer 120' so as to define at least one second pad P2'. The conductive bumps 160e are respectively disposed corresponding to the second pads P2'. Last, the second dielectric layer D2 is removed and the first solder resist layers 140' and the surface treatment layers 170' located on the first pads P1' are exposed. At the time, the circuit board has manufactured.

To sum up, in comparison with the prior art where the conductive bump should firstly be formed on the chips, and than the chips flip on the circuit board, in the present invention the circuit board has the conductive bumps, hence the subsequent manufacturing processes of connecting the chips to the circuit board can be reduced, and the product reliability and the convenience of the subsequent manufacturing processes can be effectively enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A circuit board, comprising:
   an insulation layer, having an upper surface and a lower surface opposite to each other;
   a patterned circuit layer, embedded in the insulation layer, and a surface of the patterned circuit layer aligned with the upper surface of the insulation layer, wherein the insulation layer has at least one blind via extending from the lower surface to the patterned circuit layer;

a conductive connecting structure, comprising a conductive pattern layer and at least one conductive pillar, wherein the conductive pattern layer is disposed on the lower surface of the insulation layer, and the conductive pillar is disposed inside the blind via and connects the patterned circuit layer and the conductive pattern layer;

a first solder resist layer, disposed on the lower surface of the insulation layer, and having at least one first opening, wherein the first opening exposes a portion of the conductive pattern layer so as to define at least one first pad;

a second solder resist layer, disposed on the upper surface of the insulation layer, and having at least one second opening, wherein the second opening exposes a portion of the patterned circuit layer so as to define at least one second pad; and at least one conductive bump, disposed on the second pad, wherein a top surface of the conductive bump is higher than a second surface of the second solder resist layer.

2. The circuit board as recited in claim 1, wherein the conductive bump comprises a copper bump and a copper foil layer, the copper bump is located between the copper foil layer and the second pad, and a height of the copper bump is greater than a height of the second resist layer.

3. The circuit board as recited in claim 1, wherein the conductive bump comprises a copper foil layer, a copper bump, and a nickel gold layer, the copper foil layer is located between the copper bump and the second pad, the copper bump is located between the copper foil layer and the nickel gold layer, and a height of the copper bump is greater than a height of the second solder resist layer.

4. The circuit board as recited in claim 1, wherein the conductive bump comprises a first copper foil layer, a nickel layer, and a second copper foil layer, the first copper foil layer is located between the nickel layer and the second pad, the nickel layer is located between the first copper foil layer and the second copper foil layer, and a thickness of the second copper foil layer is greater than a thickness of the first copper foil layer.

5. The circuit board as recited in claim 1, wherein the conductive bump comprises a nickel bump and a copper foil layer, the nickel bump is located between the copper foil layer and the second pad, and a height of the nickel bump is greater than a height of the second solder resist layer.

6. The circuit board as recited in claim 1, further comprising:

a surface treatment layer, disposed on the first pad, wherein a top surface of the surface treatment layer is lower than a first surface of the first solder resist layer.

7. The circuit board as recited in claim 1, wherein a portion of the first solder resist layer extends into the blind via and fills up the blind via with the conductive pillar.

8. A method of manufacturing a circuit board, comprising:

providing a first dielectric layer and two metal layers, wherein the metal layers are disposed on two opposite side surfaces of the first dielectric layer;

respectively forming a patterned circuit layer on the metal layers;

respectively pressing an insulation layer and a copper foil layer disposed on the insulation layer on the patterned circuit layers;

respectively forming at least one blind via by passing through the copper foil layers and extending to the patterned circuit layers;

respectively forming a conductive connecting structure by plating with the copper foil layers, wherein each of the conductive connecting structures comprises a conductive pattern layer and at least one conductive pillar, and each of the conductive pattern layers is disposed on a lower surface of the corresponding insulation layer, and each of the conductive pillars is disposed inside the corresponding blind via and connects the corresponding patterned circuit layer and the conductive pattern layer;

respectively forming a first solder resist layer on the lower surfaces of the insulation layers, wherein each of the first solder resist layers has at least one first opening, and the first opening exposes a portion of the corresponding conductive pattern layer so as to define at least one first pad;

removing the first dielectric layer and pressing a second dielectric layer between the first solder resist layers to expose the metal layers;

removing a portion of the metal layers so as to define at least one conductive bump on an upper surface of each of the insulation layers, wherein a surface of each of the patterned circuit layers is aligned with the upper surface of the corresponding insulation layer;

respectively forming a second solder resist layer on the upper surfaces of the insulation layers, wherein each of the second solder resist layers has at least one second opening, and the second opening exposes a portion of the corresponding patterned circuit layer so as to define at least one second pad, and the conductive bumps are disposed corresponding to the second pads; and removing the second dielectric layer to expose the first solder resist layers.

9. The method of manufacturing the circuit board as recited in claim 8, wherein each of the metal layers is a copper foil layer, and the metal layers are disposed on the two side surfaces of the first dielectric layer by a pressing process.

10. The method of manufacturing the circuit board as recited in claim 9, wherein steps of removing the portion of the metal layers so as to define the conductive bumps comprises:

respectively forming a nickel layer by plating with the copper foil layers, wherein the nickel layers respectively cover the copper foil layers;

removing a portion of the nickel layers to expose a portion of the copper foil layers;

respectively forming at least one copper bump by plating with the portion of the copper foil layers exposed by the nickel layers, wherein the copper bumps respectively contact the portion of the copper foil layers; and removing the nickel layers and the other portion of the copper foil layers not contacting with the copper bumps to expose a portion of the upper surfaces of the insulation layers.

11. The method of manufacturing the circuit board as recited in claim 9, wherein steps of removing the portion of the metal layers so as to define the conductive bumps comprises:

respectively forming a copper bump and a nickel gold layer located on the copper bump by plating with the copper foil layers, wherein the copper bumps respectively cover a portion of the copper foil layers; and removing the other portion of the copper foil layers uncovered by the copper bumps to expose a portion of the upper surfaces of the insulation layers.

12. The method of manufacturing the circuit board as recited in claim 9, wherein steps of removing the portion of the metal layers so as to define the conducive bumps comprises:

respectively forming a nickel bump by plating with the copper foil layers, wherein the nickel bumps respectively cover a portion of the copper foil layers, and removing the other portion of the copper foil layers uncovered by the nickel bumps to expose a portion of the upper surfaces of the insulation layers.

13. The method of manufacturing the circuit board as recited in claim 8, wherein a portion of the first solder resist layer extends into the blind via and fills up the blind via with the conductive pillar.

14. The method of manufacturing the circuit board as recited in claim 8, wherein each of the metal layers is a metal stacked layer, and the metal stacked layer is stacked by a first copper foil layer, a nickel layer, and a second copper foil layer, the nickel layer is located between the first copper foil layer and the second copper foil layer, and a thickness of the second copper foil layer is greater than a thickness of the first copper foil layer, and the first dielectric layer is located between the second copper foil layers.

15. The method of manufacturing the circuit board as recited in claim 14, wherein steps of removing the portion of the metal layers so as to define the conductive bumps comprises:

removing a portion of the second copper foil layers to expose a portion of the nickel layers;

removing the other portion of the nickel layers uncovered by the second copper foil layers to expose a portion of the first copper foil layers; and removing the portion of the first copper foil layers to expose a portion of the upper surfaces of the insulation layers.

16. The method of manufacturing the circuit board as recited in claim 8, wherein each of the metal layers comprises a copper foil layer, a plating nickel layer and a plating copper layer, the plating nickel layer is located between the copper foil layer and the plating copper layer, a thickness of the copper foil layer is greater than a thickness of the plating copper layer, and the first dielectric layer is located between the copper foil layers.

17. The method of manufacturing the circuit board as recited in claim 8, further comprising;

respectively forming a surface treatment layer on the corresponding first pad after respectively forming the first solder resist layers on the lower surfaces of the insulation layers, and before removing the first dielectric layer and pressing the second dielectric layer between the first solder resist layers, wherein a top surface of each of the surface treatment layers is lower than a first surface of the corresponding first solder resist layer.

\* \* \* \* \*